United States Patent [19]

Nomura et al.

[11] Patent Number: 5,656,540
[45] Date of Patent: Aug. 12, 1997

[54] SEMICONDUCTOR CRYSTAL GROWING METHOD

[75] Inventors: Yasuhiko Nomura; Shigeo Goto, both of Ibaraki; Yoshitaka Morishita, Tokyo, all of Japan

[73] Assignee: Optoelectronics Technology Research Corporation, Tokyo, Japan

[21] Appl. No.: 411,464

[22] Filed: Mar. 28, 1995

[51] Int. Cl.$^6$ .................................................. H01L 21/20
[52] U.S. Cl. ...................... 438/504; 437/89; 437/90; 437/84; 437/107; 437/133; 438/925; 117/104; 117/954
[58] Field of Search ........................ 437/133, 83, 84, 437/89, 90, 107, 132

[56] References Cited

U.S. PATENT DOCUMENTS

| | | | |
|---|---|---|---|
| 4,788,159 | 11/1988 | Smith | 437/90 |
| 4,891,013 | 1/1990 | Smith | 437/90 |
| 5,300,185 | 4/1994 | Hori et al. | 437/81 |
| 5,300,186 | 4/1994 | Kitahara et al. | 437/81 |
| 5,475,213 | 12/1995 | Fujii et al. | 250/214 LA |
| 5,545,509 | 8/1996 | Cameron et al. | 430/270.1 |

OTHER PUBLICATIONS

A. Okamoto and K. Ohata, "Selective epitaxial growth of gallium arsenide by molecular beam epitaxy", *Appl. Phys. Lett.*, vol. 51, No. 19, Nov. 9, 1987, pp.1512–1514.

H. Heinecke et al., "Selective Growth of GaAs in the Mombe and MOCVD Systems", *Journal of Crystal Growth*, vol. 77, 1986, pp. 303–309.

T. Fukui et al., "Lateral quantum well wires fabricated by selective metalorganic chemical vapor deposition", *Appl. Phys. Lett.*, vol. 57, No. 12, Sep. 17, 1990, pp. 1209–1211.

*Primary Examiner*—Charles L. Bowers, Jr.
*Assistant Examiner*—Ramamohan Rao
*Attorney, Agent, or Firm*—Sughrue, Mion, Zinn, Macpeak & Seas

[57] ABSTRACT

On a surface of a p-type GaAs (111)B substrate 11, a mesa groove is formed along a $[2\bar{1}\bar{1}]$A direction. TDMAAs as a group V material and TMGa as a group III material are supplied at $8\times10^{-3}$ Pa and $8\times10^{-4}$ Pa, respectively, to grow n-type GaAs 13 dominantly on a side surface of a mesa 12. Subsequently, the group V material is changed to metal As. $As_4$ and MAGa are supplied at $5\times10^{-3}$ Pa and $8\times10^{-4}$ Pa, respectively, to grow p-type GaAs 14 only on a side surface of the GaAs 13. Then, the group V material is again changed to TDMAAs. TDMAAs and TMGa are supplied both at $8\times10^{-4}$ Pa to grow p-type GaAs 15.

10 Claims, 4 Drawing Sheets

SEMICONDUCTOR CRYSTAL GROWING METHOD

BACKGROUND OF THE INVENTION

This invention relates to a method of carrying out crystal growth of a compound semiconductor and, in particular, to a method of controlling selective crystal growth.

In order to manufacture a semiconductor device, use is generally made of so-called selective crystal growth in which crystal growth of a compound semiconductor is restricted only to a desired area of a substrate.

There have been known conventional methods of carrying out such selective growth by the use of a thin film of $SiO_2$ or the like. According to those methods, the $SiO_2$ film is formed on a surface of a substrate and selectively removed to expose the substrate at an area on which crystal growth of the compound semiconductor has to be carried out. Subsequently, crystal growth is carried out to grow the compound semiconductor on the substrate only on the exposed area. As the methods of the type described, a method using MBE is disclosed in Applied Physics Letters, Vol. 51 (1987), pp. 1512–1514 and another method using MOCVD is disclosed in Journal of Crystal Growth, Vol. 77 (1986), pp. 303–309.

In order to bury the compound semiconductor selectively grown by the use of the $SiO_2$ film as described above, crystal growth of another compound semiconductor is made on the side surface of the compound semiconductor under two-dimensional control. Such a technique is disclosed in Applied Physics Letters, Vol. 57 (1990), pp. 1209–1211. According to this technique, the compound semiconductor is grown on a (111)B substrate by a MOCVD method. Another compound semiconductor is grown only on the side surface of the compound semiconductor previously grown by selective crystal growth.

However, in the method of carrying out selective growth by the use of the $SiO_2$ film, it is necessary to accelerate decomposition and evaporation on the $SiO_2$ film in order to inhibit crystal growth on the $SiO_2$ film. This means that crystal growth must be carried out at a high temperature. Specifically, it is reported in the above-referenced papers that the growth must be carried out at a temperature not lower than 700° C. in the MBE method and at a temperature not lower than 620° C. in the MOCVD method. The crystal growth at such a high temperature often brings about diffusion of impurities for controlling a conduction type.

In addition, in the method of carrying out selective growth by the use of the $SiO_2$ film, the crystal growth can be controlled only in a one-dimensional direction (perpendicular to the substrate).

In the method of burying the side surface of the compound semiconductor selectively grown on the (111)B substrate, another compound semiconductor later grown is formed on the $SiO_2$ film. Accordingly, it is impossible to manufacture a buried structure completely buried by the semiconductor.

Furthermore, the MOCVD method uses arsine which is highly toxic.

SUMMARY OF THE INVENTION

It is an object of this invention to provide a method of carrying out crystal growth at a low temperature without using toxic metal hydride represented by arsine and of two-dimensionally or three-dimensionally controlling crystal growth to manufacture a buried structure completely buried by a semiconductor.

According to this invention, there is provided a semiconductor crystal growing method of carrying out crystal growth of a compound semiconductor selectively in a specific area on a semiconductor substrate, the method comprising a first process of forming a step on the semiconductor substrate and a second process of carrying out crystal growth of the compound semiconductor by the use of a metal compound having an alkylamino group and an organometallic compound.

According to this invention, there is also provided a semiconductor crystal growing method as described above, wherein the first process is followed by forming one of a group V stabilized surface and a group VI stabilized surface on a surface of the semiconductor substrate so that crystal growth of the compound semiconductor in the second process is suppressed on a surface of a specific orientation.

According to this invention, there is also provided a semiconductor crystal growing method as described above, wherein impurity concentration is controlled by controlling supply amounts of the metal compound having an alkylamino group and the organometallic compound.

DESCRIPTION OF THE PREFERRED EMBODIMENTS

Figure 1:
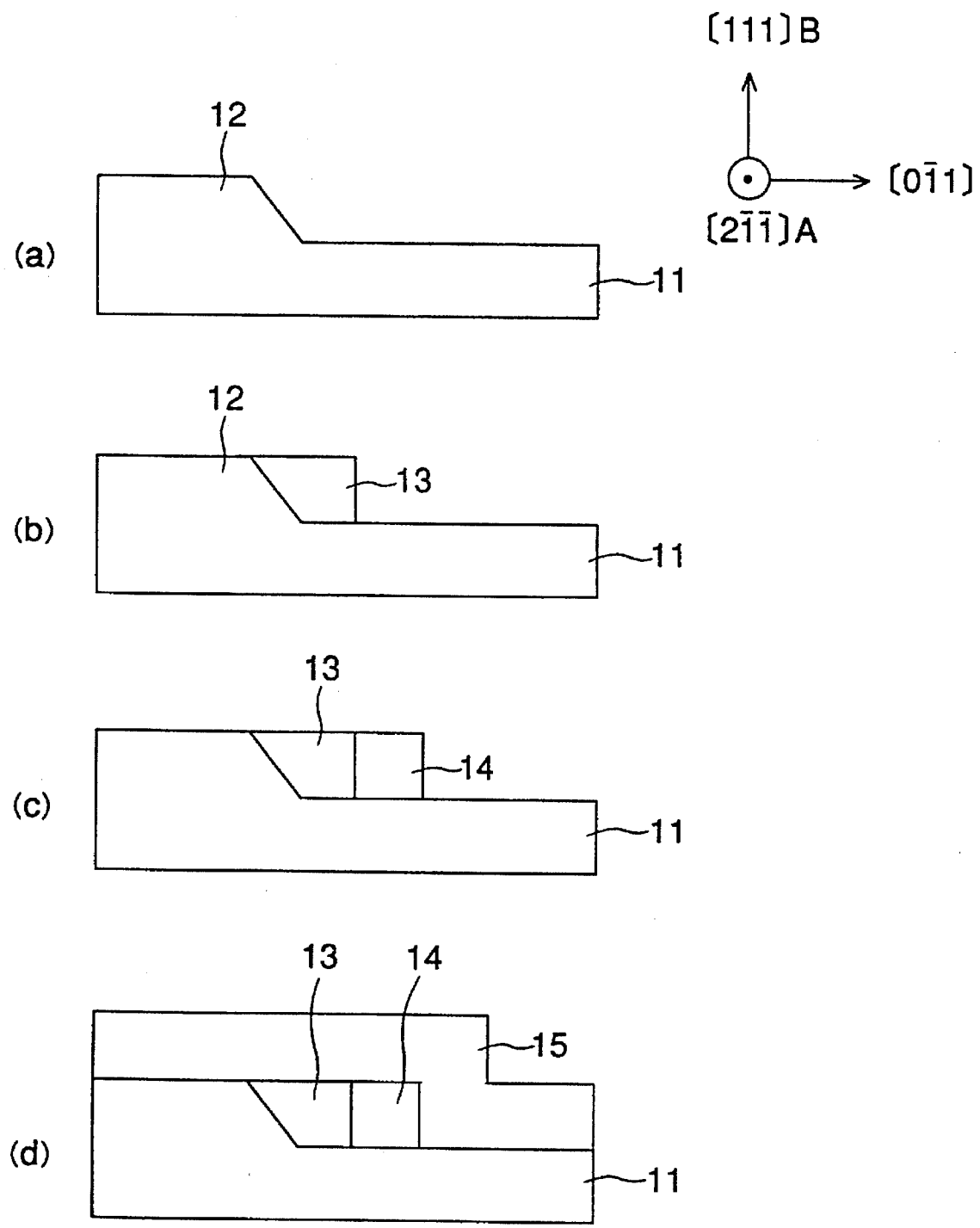
FIGS. 1(a)–(d) are views for describing each process according to a first embodiment of this invention.

Now, description will be made as regards an embodiment of this invention with reference to the drawing. At first referring to FIG. 1, a first embodiment of this invention will be described. As illustrated in FIG. 1(a), according to this embodiment, a mesa groove was at first formed on a surface of a p-type GaAs (111)B substrate 11 in a [$2\bar{1}\bar{1}$]A direction by means of ordinary photolithography and wet etching. At this time, a ($\bar{1}31$)A surface appeared on a side surface of a mesa 12.

Subsequently, the substrate 11 was loaded in a metalorganic molecular beam epitaxy (MOMBE) device. By the use of trisdimethylaminoarsine (TDMAAs: $As(N(CH_3)_2)_3$) as a group V material and trimethylgallium (TMGa) as a group III material, crystal growth of GaAs was carried out. It is noted here that fluxes of TDMAAs and TMGa were adjusted to $8\times10^{-3}$ Pa and $8\times10^{-4}$ Pa, respectively. A substrate temperature was kept at 530° C.

Under the above-mentioned conditions, TDMAAs had a higher pressure than TMGa. During progress of growth, the surface of the substrate was stabilized by As. Accordingly, crystal growth did not take place on a (111)B surface of the substrate 11. As illustrated in FIG. 1(b), GaAs 13 was grown dominantly on a side surface of the mesa 12. At this time, the GaAs 13 had the side surface which formed a ($0\bar{1}1$) surface perpendicular to the (111)B surface. The GaAs 13 exhibited n-type conduction and had carrier concentration of $1\times10^{17}$ $cm^{-3}$. The side surface of the GaAs 13 formed the ($0\bar{1}1$) surface under the above-mentioned conditions but could be rendered coincident with the side surface of the mesa 12 by controlling growth conditions such as a supply ratio of TMDAAs and TMGa and a growth temperature.

In the above-mentioned process, the crystal growth did not take place on the (111)B surface. This is because, when a metal compound having an alkylamino group is decomposed on the surface of the substrate, a chemically active species is formed. The active species has an influence upon decomposition of an organometallic compound and also upon adsorption, diffusion, and release of decomposed products on the surface of the substrate. Specifically, in crystal growth of the compound semiconductor by the use of the metal compound having an alkylamino group, a growing speed has a greater surface dependency as compared with the case where an ordinary material (metal element or hydride thereof) is used. A group V or a group VI stabilized surface on the (111)B surface is so stable that decomposition of the organometallic compound on that surface is remarkably suppressed. Accordingly, if crystal growth by the use of the organometallic compound is carried out on the substrate having a step formed by the (111)B surface and the other surface except the (111)B surface, crystal growth takes place dominantly on the other surface except the (111)B surface. The metal compound having an alkylamino group has a lower-decomposition temperature than hydride containing the same metal element. Therefore, a metal stabilized surface is obtained at a lower temperature.

Next, the group V material was changed to metal As. The fluxes Of $As_4$ and TAGa were adjusted to $5\times10^{-3}$ Pa and $8\times10^{-4}$ Pa, respectively. The substrate temperature was kept at 530° C. Under the conditions, growth of GaAs was carried out. Under these conditions also, the GaAs was not grown on the (111)B surface. As illustrated in FIG. 1(c), the GaAs 14 was grown only on the side surface of the GaAs 13. The GaAs 14 exhibited p-type conduction because the metal As was used as the group V material, and had carrier concentration of $1\times10^{20}$ cm$^{-3}$. Thus, as a result of this growth, a p-n junction in a lateral direction was formed on the substrate 11. By repeating the above-mentioned process, it is possible to form a plurality of p-n junctions.

Subsequently, TDMAAs was again used as the group V material. The fluxes of TDMAAs and TMGa were both adjusted to $8\times10^{-4}$ Pa. The substrate temperature was kept at 580° C. Under the conditions, growth of GaAs was carried out. Under these conditions, crystal growth took place on the (111)B surface also. As a consequence, p-type GaAs 15 having carrier concentration of $1\times10^{19}$ cm$^{-3}$ was formed. Thus, the n-type GaAs 13 was buried by the p-type GaAs 11, 14, and 15. During growth of the GaAs 15, the metal As may be simultaneously used as the group V material to improve a surface flatness of the GaAs 15.

In the above-mentioned process, TDMAAs was used as the group V material in the manner similar to the process of forming the n-type GaAs 13. However, the GaAs 15 exhibited p-type conduction. This is because a chemically active species produced upon decomposition of the metal compound having an alkylamino group serves to remove, from the surface of the substrate, carbon produced upon decomposition of the organometallic compound. Carbon is one of typical impurities which determine The conduction type of the compound semiconductor. By controlling the supply amount of the metal compound having an alkylamino group, carbon concentration can be controlled. It is therefore possible to control the conduction type of the compound semiconductor which is grown.

As described above, according to this invention, it is possible to carry out selective growth at a low temperature as compared with the conventional MBE and MOCVD methods. By the use of TDMAAs, it is possible to remove carbon produced by decomposition of the organometallic compound. Therefore, the impurity concentration can be controlled by controlling the supply ratio of the gaseous materials. In addition, the growth direction and the conduction type can be two-dimensionally controlled.

Figure 2:
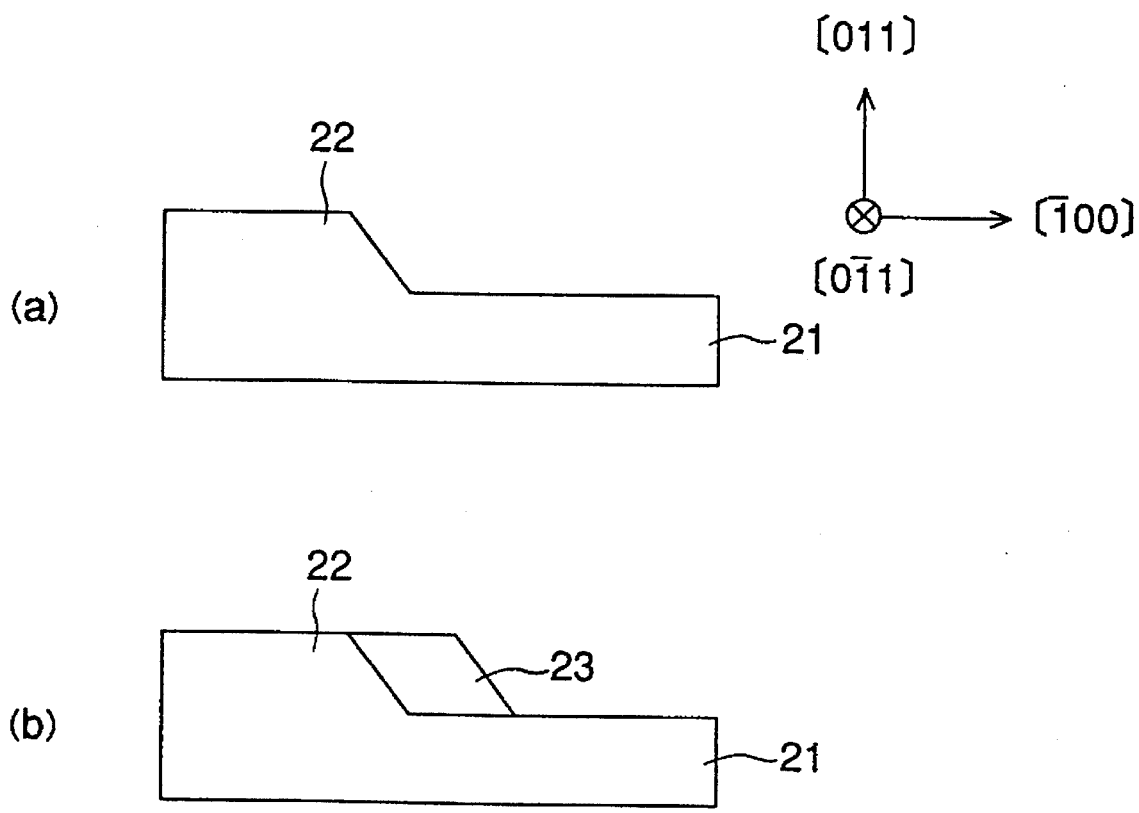
FIGS. 2(a) and (b) are views for describing each process according to a second embodiment of this invention.

Next referring to FIG. 2, description will be made as regards a second embodiment of this invention. In this embodiment, a p-type GaAs (011) substrate 21 was used. At first referring to FIG. 2(a), a mesa groove was formed along a [01$\bar{1}$] direction. At this time, a ($\bar{1}$11)B surface appeared on a side surface of a mesa 22.

Subsequently, the substrate 21 was loaded in a MOMBE device. Trisdimethylaminoarsine (TDMAAs) was used as a group V material while trimethylgallium (TMGa) was used as a group III material. Crystal growth Of GaAs was carried out by alternately supplying TDMAAs and TMGa onto the substrate 21. The fluxes of TDMAAs and TMGa were both adjusted to $8\times10^{-4}$ Pa. Supply periods were 10 seconds and 3 seconds, respectively. As a consequence no substantial growth took place on a (011) surface of the substrate 21, as illustrated in FIG. 2(b). Crystal growth of GaAs 23 took place dominantly on the ($\bar{1}$11)B surface which was the side surface of the mesa 22. Thus, according to this embodiment, selective growth was achieved even by the use of the substrate having a surface orientation different from that of the (111)B substrate.

Figure 3:
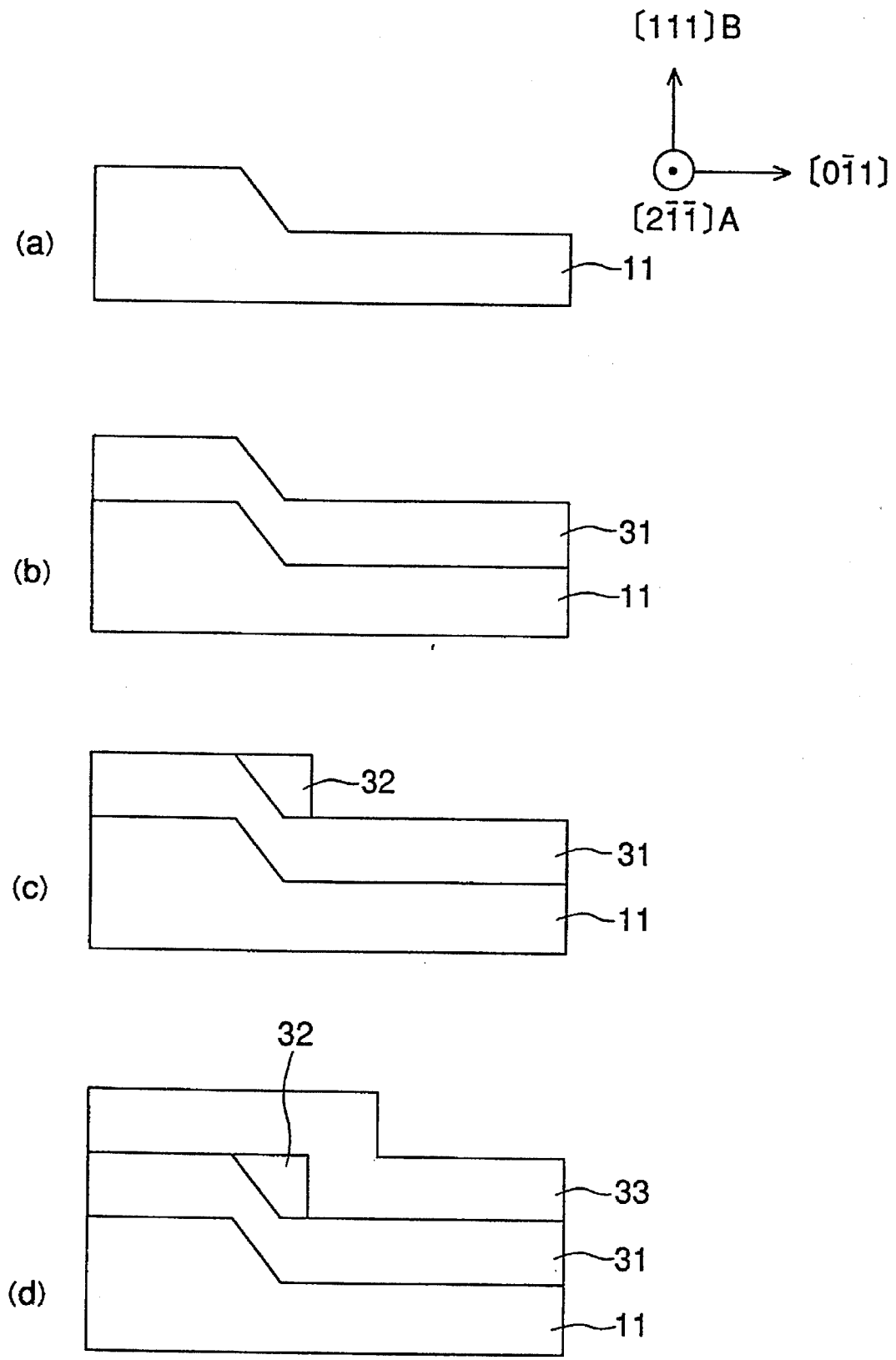
FIGS. 3(a)–(d) are views for describing each process according to a third embodiment of this invention.

Next referring to FIG. 3, a third embodiment of this invention will be described. In this embodiment, use was made of the GaAs (111)B substrate 11 similar to that used in the first embodiment. As illustrated in FIG. 3(a), the mesa groove was formed in the manner similar to the first embodiment. The substrate was loaded in the MOMBE device and held for 10 minutes with the substrate temperature kept at 500° C. and the flux of TDMAAs adjusted to $4\times10^{-3}$ Pa. Through the above-mentioned treatment, a natural oxide film (not shown), which has been formed on the surface of the substrate 11, could be removed. The substrate temperature was about 100° C. lower than that in a method of removing the natural oxide film under an $As_4$ pressure in the normal MBE method.

Next, as illustrated in FIG. 3(b), AlGaAs 31 was grown on an entire surface of the substrate 11 by means of the normal MBE method. Thereafter, crystal growth of GaAs was carried out by the use of TDMAAs and TMGa with their fluxes adjusted to $8\times10^{-4}$ Pa and $8\times10^{-4}$ Pa, respectively, and the substrate temperature kept at 530° C. As a consequence, no crystal growth took place on the (111)B surface, like the first embodiment. As illustrated in FIG. 3(c), crystal growth of GaAs 32 took place on a side surface of a mesa of the AlGaAs 31.

Subsequently, again by means of the MBE method, AlGaAs 33 was grown to bury the GaAs 32 as illustrated in FIG. 3(d). Thus, a quantum wire structure was manufactured. The sample thus obtained was evaluated in terms of photoluminescence. As a result, it has been observed that luminescence was shifted towards a shortwave side due to quantization. A half value width of the luminescence was improved to about one third as compared with a comparative sample manufactured by executing the above-mentioned process after the natural oxide film was removed under the $As_4$ pressure at the substrate temperature of 620° C.

In this embodiment, the quantum wire structure was manufactured by forming a stripe-shaped step (or mesa groove) on the substrate 11. Alternatively, a quantum box structure may be formed by making the step to be formed on the substrate have a prism shape or a conical shape. In other words, it is possible to three-dimensionally control the growth amount and the conduction type.

Finally, description will proceed to a fourth embodiment of this invention. In this embodiment, a Si (100) substrate was used. At first, the Si (100) substrate was loaded in the MOMBE device and treated for 10 minutes under the conditions that the substrate temperature was kept at 650° C. and the TDMAAs flux was adjusted to $4\times10^{-4}$ Pa. Thus, the natural oxide film on the surface of the substrate was removed. Then, at the substrate temperature of 400° C. and with the TDMAAs flux of $4\times10^{-3}$ Pa and the TMGa flux of $8\times10^{-4}$ Pa, crystal growth of GaAs was carried out on the substrate. In case where crystal growth of GaAs is carried out on the Si substrate by means of the ordinary MBE or MOCVD method, differences in lattice constant and in thermal expansion coefficient between Si and GaAs cause dislocation not smaller than $10^6$ $cm^{-2}$ to occur in the GaAs which has been grown. On the other hand, in this embodiment, the dislocation density in the grown GaAs was as very low as $5\times10^4$ $cm_{-2}$ and the surface flatness was remarkably improved. This is because the chemically active species obtained by decomposition of the metal compound having an alkylamino group has an influence upon nucleation on the surface of the substrate. Specifically, in semiconductor crystal growth of a lattice mismatching type, growth of a three-dimensional island is suppressed while growth of a two-dimensional layer is accelerated.

In the foregoing embodiments, description has been directed to growth of GaAs. However, this invention is similarly applicable to another group III–V compound semiconductor and to a group II–VI compound semiconductor such as GaP, InP, InAs, and ZnSe, provided that individual component elements are respectively contained in the metal compound having an alkylamino group and the organometallic compound which are used as the materials.

Figure 4:
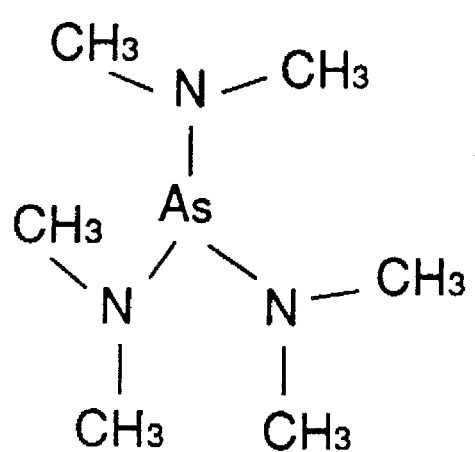
FIG. 4 shows a molecular structure of TDMAAs.

The above-mentioned embodiments have been described in conjunction with the cases where TDMAAs was used. Alternatively, use may be made of the metal compound having another alkylamino group (two alkyl groups coupled to nitrogen). For example, in a molecular structure of TDMAAs illustrated in FIG. 4, at most two of three $N(CH_3)_2$ may be replaced by H. Alternatively, $CH_3$ may be replaced by another alkyl group ($C_nH_{2n+1}$) which is a higher macromolecule than $CH_3$.

As described above, according to this invention, crystal growth can be more safely carried out by the use of the alkylamino group and the organometallic compound, as compared with the conventional method. In addition, it is possible to realize selective growth of the compound semiconductor at a lower temperature. By controlling the supply ratio of the alkylamino group and the orgamometallic compound, it is possible to control the impurity concentration in the compound semiconductor which is grown. Furthermore, by the use of the substrate having the step and by controlling the supply ratio of the alkylamino group and the organometallic compound, the growth amount and the conduction type can be two-dimensionally or three-dimensionally controlled.

According to this invention, in semiconductor crystal growth of a lattice mismatching type, it is possible by the use of the alkylamino group and the organometallic compound to remarkably reduce the dislocation density in a crystal growth film as compared with the conventional method.

What is claimed is:

1. A semiconductor crystal growing method of carrying out crystal growth of a compound semiconductor selectively in a specific area on a semiconductor substrate, said method comprising a first process of forming a step on said semiconductor substrate and a second process of carrying out crystal growth of said compound semiconductor by the use of a metal compound having an alkylamino group and an organometallic compound.

2. A semiconductor crystal growing method as claimed in claim 1, wherein at least one of a surface of said semiconductor substrate and an exposed surface exposed by said first process is a (111)B surface.

3. A semiconductor crystal growing method as claimed in claim 1, wherein said first process is followed by radiating a metal compound having said alkylamino group onto a surface of said semiconductor substrate to remove impurities attached to the surface of said semiconductor substrate.

4. A semiconductor crystal growing method as claimed in claim 1 or 3, wherein said second process is preceded by forming one of a group V stabilized surface and a group VI stabilized surface on a surface of said semiconductor substrate so that crystal growth of said compound semiconductor in said second process is suppressed on a surface of a specific orientation.

5. A semiconductor crystal growing method as claimed in claim 4, wherein said surface of a specific orientation is a (111)B surface.

6. A semiconductor crystal growing method as claimed in claim 4, wherein said second process is followed by crystal growth of a different compound semiconductor different from said compound semiconductor, said different compound semiconductor being grown on the surfaces of said semiconductor substrate and said compound semiconductor to manufacture a multi-dimensional quantum confinement structure.

7. A semiconductor crystal growing method as claimed in any one of claims 1, 3, 4, and 6, wherein said second process is carried out by alternately supplying said metal compound having said alkylamino group and said organometallic compound.

8. A semiconductor crystal growing method as claimed in any one of claims 1, 3, 4, 6, and 7, wherein said second process is carried out by the use of a metal element in addition to said metal compound having said alkylamino group and said organometallic compound, said metal element being a component of said metal compound having said alkylamino group.

9. A semiconductor crystal growing method as claimed in any one of claims 1, 3, 4, 6, 7, and 8, wherein impurity concentration is controlled by controlling either supply amounts of said metal compound having said alkylamino group and said organometallic compound or supply amounts of said metal compound having said alkylamino group, said organometallic compound, and said metal element.

10. A semiconductor crystal growing method of carrying out crystal growth of a compound semiconductor on a substrate having a different lattice constant, wherein crystal growth is carried out by supplying, as a metal compound having an alkylamino group, at least one of elements composing said compound semiconductor.

* * * * *